(12) United States Patent
Ye et al.

(10) Patent No.: US 6,275,071 B1
(45) Date of Patent: Aug. 14, 2001

(54) DOMINO LOGIC CIRCUIT AND METHOD

(75) Inventors: Yibin Ye, Hillsboro; Siva G. Narendra; Vivek K. De, both of Beaverton, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/474,533

(22) Filed: Dec. 29, 1999

(51) Int. Cl.[7] .................................................. H03K 19/096

(52) U.S. Cl. ................................ 326/98; 326/93; 326/95

(58) Field of Search .......................... 326/22–24, 26–28, 326/93, 95–98; 327/208, 210

(56) References Cited

U.S. PATENT DOCUMENTS

| | | | |
|---|---|---|---|
| 4,571,510 | 2/1986 | Seki et al. | 307/449 |
| 4,899,066 | * 2/1990 | Aikawa et al. | 307/45.2 |
| 5,115,150 | 5/1992 | Ludwig | 307/475 |
| 5,258,666 | * 11/1993 | Furuki | 307/449 |
| 5,453,708 | 9/1995 | Gupta et al. | 326/98 |
| 5,543,735 | 8/1996 | Lo | 326/93 |
| 5,568,062 | 10/1996 | Kaplinsky | 326/27 |
| 5,661,675 | 8/1997 | Chin et al. | 364/768 |
| 5,671,151 | 9/1997 | Williams | 364/489 |
| 5,748,012 | 5/1998 | Beakes et al. | 326/93 |
| 5,796,282 | 8/1998 | Sprague et al. | 327/210 |
| 5,815,005 | 9/1998 | Bosshart | 326/95 |
| 5,825,208 | 10/1998 | Levy et al. | 326/98 |
| 5,831,990 | 11/1998 | Queen et al. | 371/22.1 |
| 5,852,373 | * 12/1998 | Chu et al. | 326/98 |
| 5,889,417 | 3/1999 | Klass et al. | 326/98 |
| 5,892,372 | 4/1999 | Ciraula et al. | 326/96 |
| 5,896,046 | 4/1999 | Bjorksten et al. | 326/98 |

(List continued on next page.)

FOREIGN PATENT DOCUMENTS

| | | | |
|---|---|---|---|
| 4-239221 | 8/1992 | (EP) | H03K/19/096 |
| 0954101 | 3/1999 | (EP) | H03I/19/096 |

OTHER PUBLICATIONS

Bryant, R.E., "Graph–Based Algorithms for Boolean Function Manipulation", *IEEE Transactions on Computers, C–35* (8) , pp. 677–691, (1986).

Chakradhar, S.T., et al., "An Exact Algorithm for Selecting Partial Scan Flip–Flops", Proceedings of the 31st Design Automation Conference, San Diego, California, pp. 81–86, (1994).

Chakravarty, S., "On the Complexity of Using BDDs for the Synthesis and Analysis of Boolean Circuits", 27th Annual Allerton Conference on Communication, Control, and Computing, Allerton House, Monticello, Illinois, pp. 730–739, (1989).

Patra, P., et al., "Automated Phase Assignment for the Synthesis of Low Power Domino Circuits", Proceedings of the 36th ACM/IEEE Conference on Design Automation, pp. 379–384, (1999).

Puri, et al., "Logic Optimization by Output Phase Assignment in Dynamic Logic Synthesis", International Conference on Computer Aided Design, 7 p., (1996).

*Primary Examiner*—Michael Tokar
*Assistant Examiner*—Vibol Tan
(74) *Attorney, Agent, or Firm*—Schwegman, Lundberg, Woessner & Kluth, P.A.

(57) ABSTRACT

A domino logic circuit includes input connections to receive a clock signal and at least one input data signal. In one embodiment, the domino logic circuit includes a dynamic stage comprising precharge circuitry, and a static stage that comprises discharge circuitry. In another embodiment, the domino logic circuit includes a dynamic stage comprising discharge circuitry, and a static stage that comprises precharge circuitry. Different configurations and transistor types have also been described. The circuitry can provide improved speed performance, or increase noise immunity.

24 Claims, 10 Drawing Sheets

U.S. PATENT DOCUMENTS

| | | | |
|---|---|---|---|
| 5,896,399 | | 4/1999 | Lattimore et al. ........... 371/21.1 |
| 5,898,330 | * | 4/1999 | Klass ........................... 327/210 |
| 5,917,355 | * | 6/1999 | Klass ........................... 327/208 |
| 5,942,917 | | 8/1999 | Chappell et al. ............ 326/121 |
| 6,002,292 | | 12/1999 | Allen et al. .................. 327/379 |
| 6,049,231 | | 4/2000 | Bosshart ........................ 326/98 |
| 6,052,008 | | 4/2000 | Chu et al. ..................... 327/200 |
| 6,060,910 | | 5/2000 | Inui ................................ 326/98 |
| 6,087,855 | | 7/2000 | Frederick, Jr. et al. ..... 326/106 |
| 6,108,805 | | 8/2000 | Rajsuman ..................... 714/724 |
| 6,133,759 | | 10/2000 | Beck et al. ..................... 326/98 |

\* cited by examiner

DOMINO LOGIC CIRCUIT AND METHOD

TECHNICAL FIELD OF THE INVENTION

The present invention relates generally to logic circuitry and in particular the present invention relates to improved domino-type logic circuitry.

BACKGROUND OF THE INVENTION

In the field of semiconductor devices, the frequency of operation of the devices is constantly increasing. For clocked logic devices, therefore, signal evaluation time is decreasing. That is, the time allotted for a logic input to propagate to a logic output is decreasing. Domino circuits are used in integrated circuits to speed operating time. In a domino circuit, data is received on a first transition of a clock, and the signal is coupled to other circuitry on a next transition of the clock.

Conventional domino circuitry includes dynamic circuitry coupled to static gate circuits. The dynamic circuitry precharges an input of the static circuitry when a clock signal is low, and couples an input data signal to the static circuitry when the clock signal is high. The dynamic circuitry includes n-type metal oxide semiconductor (NMOS) pull-down circuitry. If the NMOS pull-down circuitry comprises low threshold voltage transistors, the domino circuitry is susceptible to noise.

The pull-down circuitry can comprise serially coupled pull down transistors. The speed of this serial pull-down circuitry can adversely impact the operation of the domino circuit by slowing the operation, or increasing noise susceptibility.

For the reasons stated above, and for other reasons stated below which will become apparent to those skilled in the art upon reading and understanding the present specification, there is a need in the art for a domino circuit which has good operation speed characteristics. There is also a need for a domino circuit that has adequate noise immunity.

SUMMARY OF THE INVENTION

In one embodiment, a domino circuit comprises a dynamic circuit stage having at least one data input node to receive an input data signal, and a clock input node to receive a clock signal. The dynamic circuit provides an output data signal on an output data node when the clock signal is a first state. The domino circuit further comprises a static circuit stage having an input node coupled to receive the output data signal from the dynamic circuit stage. The static circuit stage comprises a plurality of series coupled pull-up transistors coupled to the input, and a precondition circuit coupled to a first intermediate node located between the plurality of pull-up transistors. The precondition circuit provides either a pre-charge or discharge voltage to the first intermediate node when the clock signal is in a second state.

In another embodiment, a domino circuit comprises a dynamic stage circuit having an output connection. The dynamic stage circuit comprises a first pull-up transistor coupled to the output connection, a latch circuit coupled to the output connection, and a plurality of pull-down transistors coupled to the output connection. The dynamic stage circuit further comprises a pre-charge transistor coupled to a first intermediate node of the plurality of pull-down transistors. The domino circuit also comprises a static stage circuit having an input node coupled to the output connection of the dynamic stage circuit. The static stage circuit comprises an output node and a plurality of pull-up transistors connected in series between the output node and an upper voltage supply connection. A discharge transistor is coupled to a second intermediate node of the plurality of pull-up transistors.

In yet another embodiment, a domino circuit comprises a dynamic stage circuit having an output connection. The static stage circuit comprises a first pull-up transistor coupled to the output connection, a latch circuit coupled to the output connection, and a plurality of pull-down transistors coupled to the output connection. The dynamic stage circuit further comprises a discharge transistor coupled to a first intermediate node of the plurality of pull-down transistors. The domino circuit further comprises a static stage circuit having an input node coupled to the output connection of the dynamic stage circuit. The static stage circuit comprises an output node and a plurality of pull-up transistors connected in series between the output node and an upper voltage supply connection. A pre-charge transistor is coupled to a second intermediate node of the plurality of pull-up transistors.

DETAILED DESCRIPTION OF EMBODIMENTS OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

Figure 1:
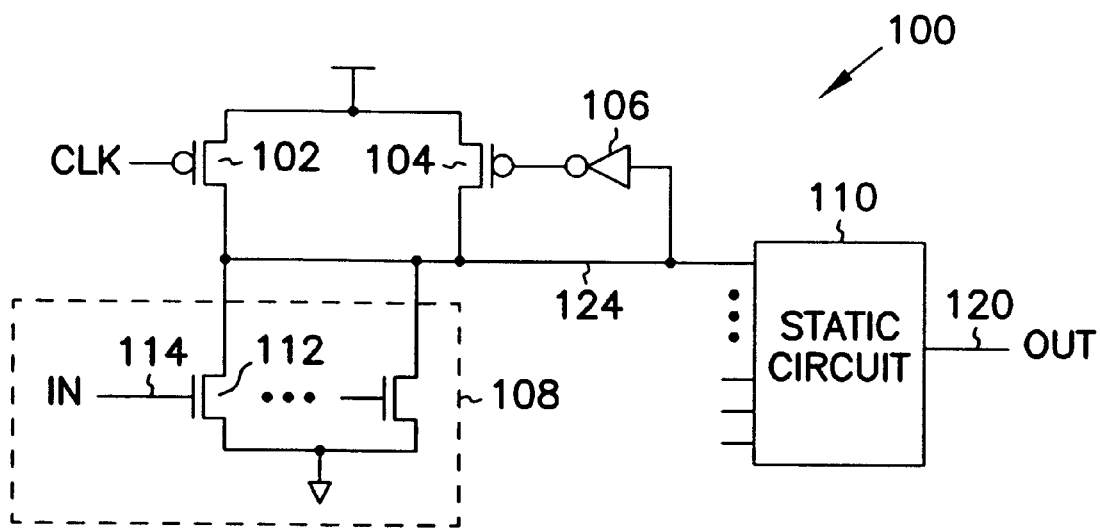
FIG. 1 is a schematic diagram of a prior art domino circuit.

A conventional domino logic circuit 100 is illustrated in FIG. 1. The domino circuit comprises two stages, a dynamic stage and a static stage. The dynamic stage includes a pull-up p-channel field effect transistor (PFET) 102, p-channel FET 104 and inverter 106. PFETs can be formed as metal oxide semiconductors. Transistor 102 is operated in response to a clock signal (CLK), such that the transistor is active when the clock signal is low. Transistor 104 is activated in response to a low gate voltage produced by inverter 106. Transistor 104 and inverter 106, therefore, operate as a latch circuit to maintain a high pre-charge voltage on node 124. A pull-down circuit 108 is coupled to node 124 to selectively couple node 124 to a low voltage (VSS) in response to input data signals.

As shown in FIG. 1, a pull-down circuit can comprise a plurality of parallel n-channel FETs 112 which can be selectively activated in response to input data signals provided on the transistor gate connections 114. In operation, when the clock signal is low, node 124 is pre-charged to VCC through transistor 102 and is maintained at VCC via transistor 104. When the clock signal has a high voltage, transistor 102 is not active and transistors 112 can pull node 124 to VSS in response to a high voltage on an input connection 114. The domino circuit includes a static circuit 110 which provides an output signal on node 120. The static circuit can comprise any variety of complementary metal oxide (CMOS) circuits. It is common to use a CMOS logic circuit such as an inverter or NAND gate which inverts a voltage provided on node 124. It will be appreciated by those skilled in the art that domino circuit 100 can be highly susceptible to noise present on input connections 114 when n-channel transistors 112 have a low threshold voltage, Vt. The noise susceptibility problem will be explained in greater detail below.

Figure 2A:
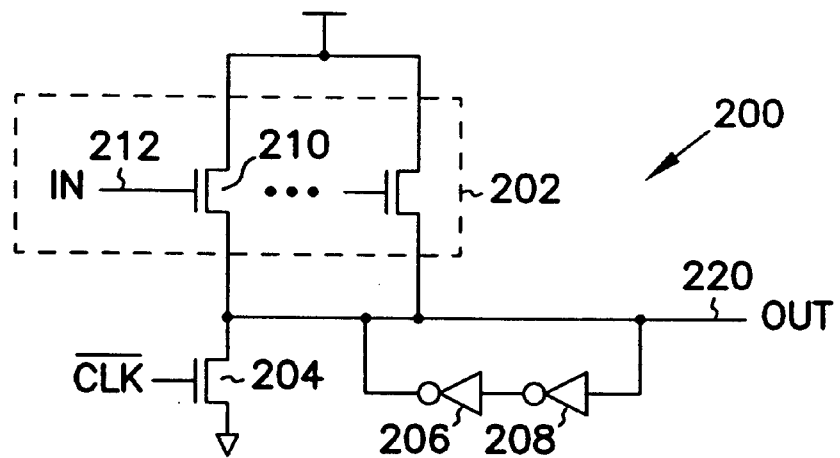
FIGS. 2(A)–(C) are schematic diagrams of alternative domino circuitry.

It is noted that this domino circuit receives an input signal that is low when the clock signal is low. To prevent contention between transistors 102 and 112, output 120 can be coupled to an input connection 114 of a subsequent domino circuit. Because output 120 is an inverted voltage from node 124, the input of the subsequent domino circuit is low during the pre-charge phase. FIG. 2A illustrates a first stage of a domino circuit 200. The domino circuit includes an n-channel pull-down transistor 204, series coupled inverters 206 and 208, and pull-up circuit 202. The pull-up circuit comprises one or more n-channel pull-up transistors 210. Transistors 210 are fabricated such that they have a relatively low threshold voltage. It is contemplated that the pull-up transistors have a low threshold voltage. For example, the low threshold voltage can be considered to be one that is less than 0.3 volts. In one embodiment the threshold voltage can be in the range of 0.2 to 0.3 volts. Conversely, conventional n-channel transistor threshold voltages tend to above 0.3 volts. It will be appreciated, however, that one embodiment can include transistors having a threshold voltage above 0.3 volts, but still considered low. In operation, pull-down transistor 204 is activated when the clock signal is low (/CLK is high). As such, node 220 is pulled low to a pre-discharge state of VSS. Inverters 206 and 208 are coupled to latch a voltage on node 220.

Figure 2B:
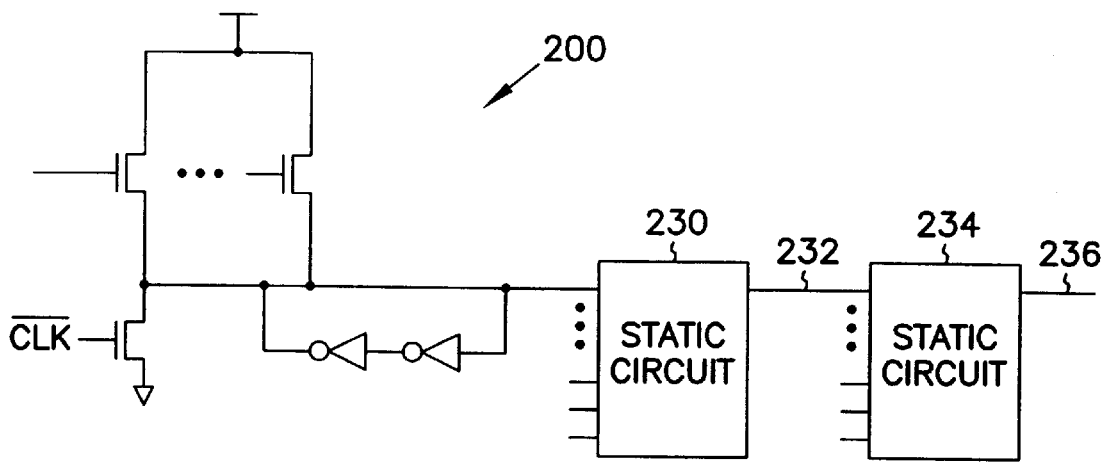

When the clock signal is high, transistor 204 is not activated and pull-up transistors 210 can pull node 220 toward VCC. It will be appreciated, however, that node 220 cannot reach VCC through transistors 210, but is limited by a threshold voltage to VCC-Vt. To drive node 220 to VCC, inverter 206 is provided. That is, inverter 206 can be fabricated using series coupled transistors 221 and 223, as illustrated in FIG. 2B. P-channel transistor 221, therefore, pulls node 220 to VCC. It should be noted, that node 220 will remain at VSS if the pull-up circuit 202 is not activated.

As stated above, the conventional domino circuit illustrated in FIG. 1 is typically implemented with two stages, the dynamic stage and a static stage. As explained, the dynamic stage provides an output signal on node 124 which transitions from VCC to VSS in response to an input data signal. The static circuit 110 inverts this signal to provide an output signal on node 120 which transitions from VSS to VCC. Domino circuits can be implemented as either a one stage circuit as illustrated in FIG. 2A, or a three-stage circuit as illustrated in FIG. 2B.

Figure 2C:
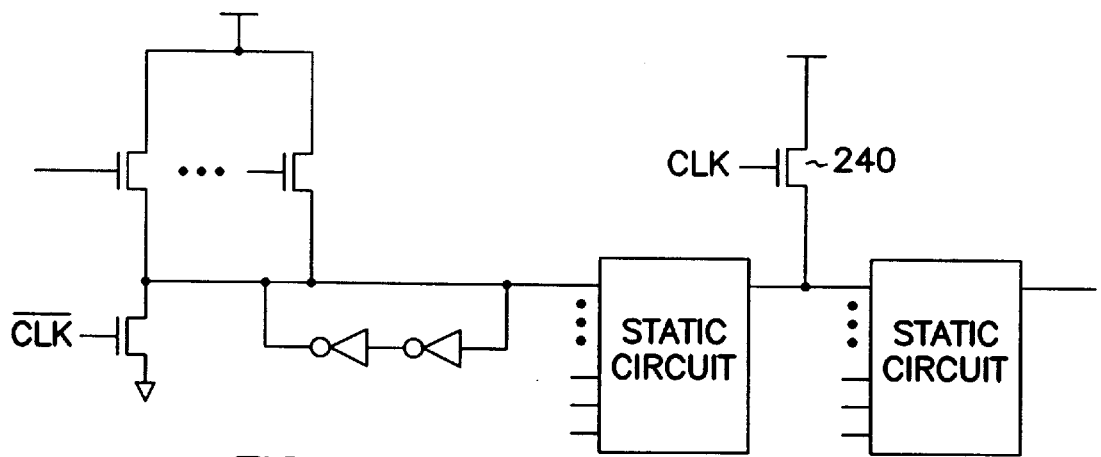
Figure 3:
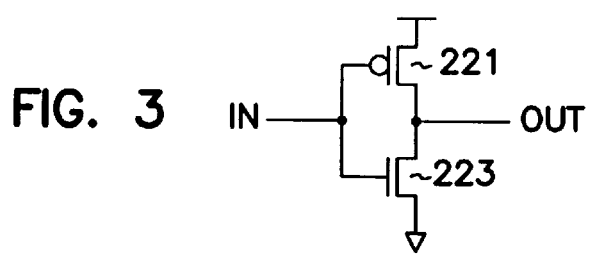
FIG. 3 illustrates an inverter circuit.

Referring to FIG. 2B, the domino circuit is illustrated which includes a dynamic circuit 200, a first static circuit 230 and a second static circuit 234. The static circuits include MOS logic gates, including but not limited to inverters, NANDs and NORs. It will be appreciated than any type, or combination, of static circuit can be provided which inverts a signal provided on an input node. The first static circuit can be fabricated such that it is skewed for fast fall transitions. That is, the static circuit is fabricated having large NMOS pull-down devices, and small PMOS pull-up devices. The amount of skewing is not critical, but is primarily limited by a noise margin requirement. The second static circuit can be skewed for fast rise times (large pull-up devices and small pull-down devices). In one embodiment, the first static circuit is highly skewed and the second static circuit is less aggressively skewed in order to block noise from propagating into following stages. It is noted that as the first static circuit is skewed for fast fall times, the rise of its output node is relatively slow in the pre-discharge phase. As such, an optional pull-up transistor 240 can be provided between the first and second static circuits, as illustrated in FIG. 2C.

It is noted that domino circuit 200 receives an input signal at 212 that is low when the clock signal is low (/CLK high). This prevents contention between the transistors 210 and 204. Intermediate node 220 can be coupled to an input connection 212 of a subsequent domino dynamic circuit. The input data signal of the subsequent domino circuit, therefore, has a low state during the pre-discharge phase. To maintain this relationship, two static stages are coupled in series to node 220, FIG. 2B. The output of circuit 234 can be coupled to an input of a subsequent domino circuit without concern of contention. The domino circuitry of FIGS. 2A, 2B and 2C are compatible with the circuitry of FIG. 1.

Stacked Node Domino Circuitry

Figure 4:
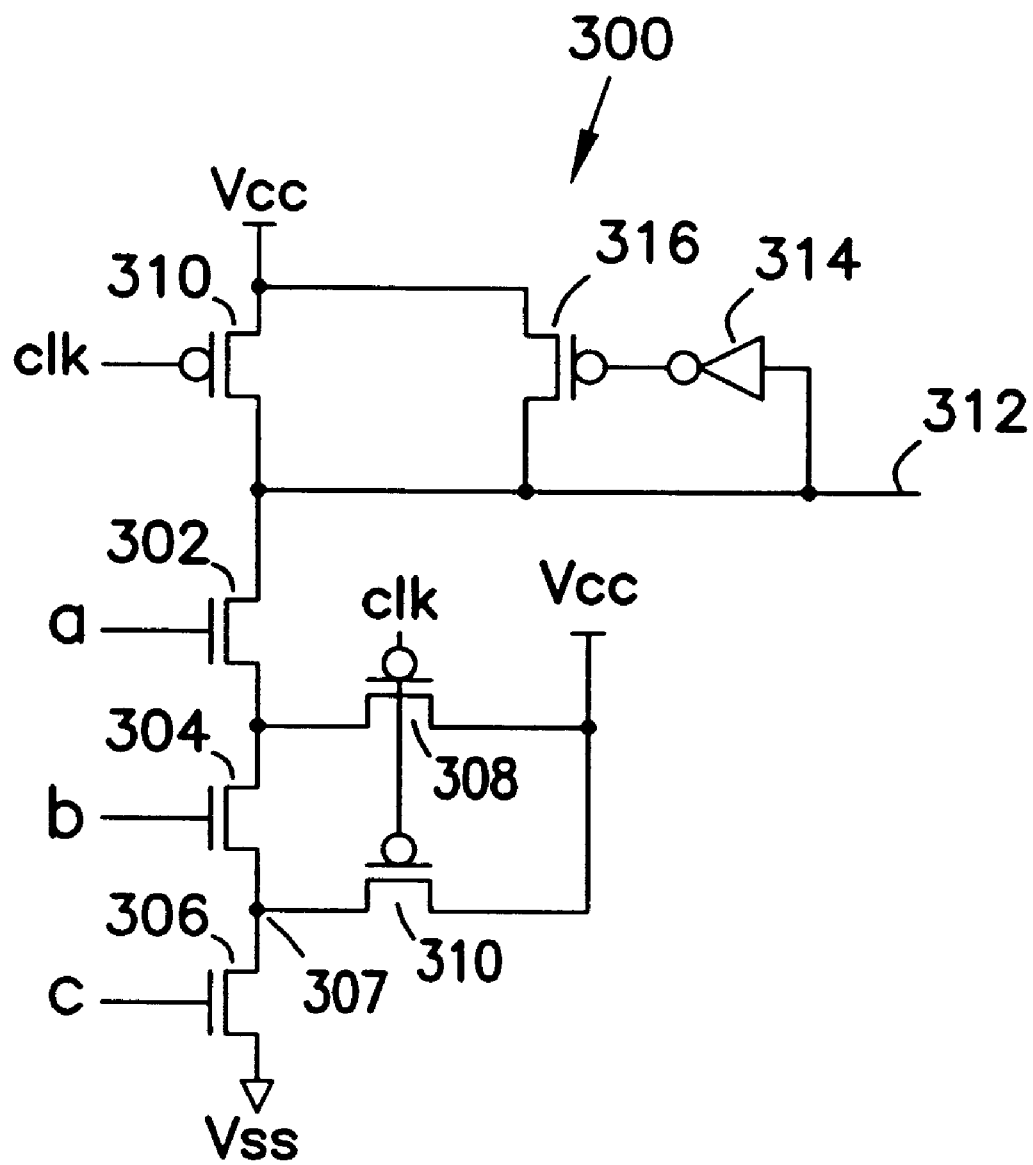
FIG. 4 is a schematic diagram of a prior art dynamic stage of a domino circuit.
Figure 5:
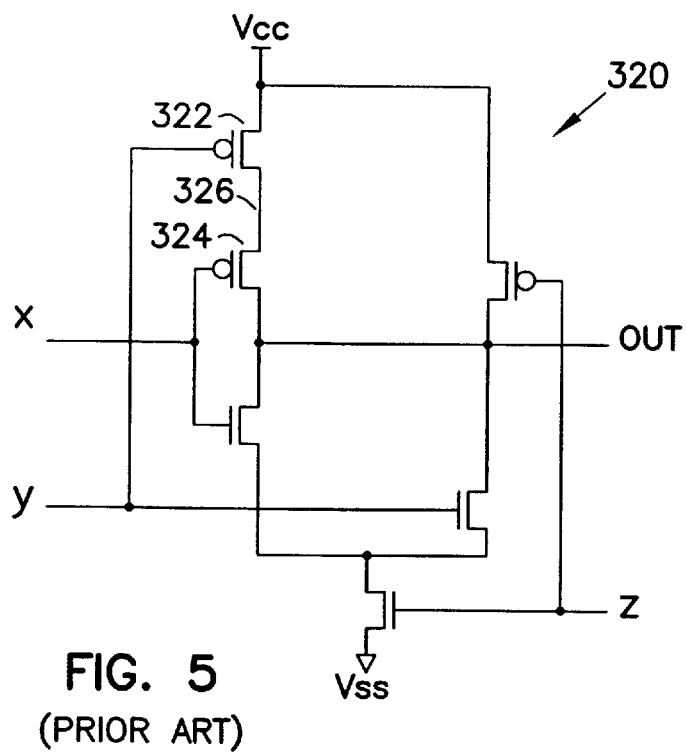
FIG. 5 illustrates a schematic diagram of a prior art static stage circuit.

FIG. 4 is a schematic diagram of a dynamic stage 300 of a domino circuit having multiple pull down transistors 302, 304, 306. The pull down transistors are n-channel CMOS transistors connected in a serial manner. There are intermediate nodes 307 and 309 provided between each of the pull down transistors. Pull up P-channel CMOS transistors 308 and 310 are coupled to the intermediate nodes to provide a pre-charge operation, as explained in more detail below. FIG. 5 illustrates a schematic diagram of a prior art static stage 320 of the domino circuit that includes multiple serial connected pull up transistors 322 and 324. Again, an intermediate node 326 is provided between the pull up transistors. The intermediate node does not have any preconditioning circuitry coupled to it, but instead is left floating.

Figure 6:
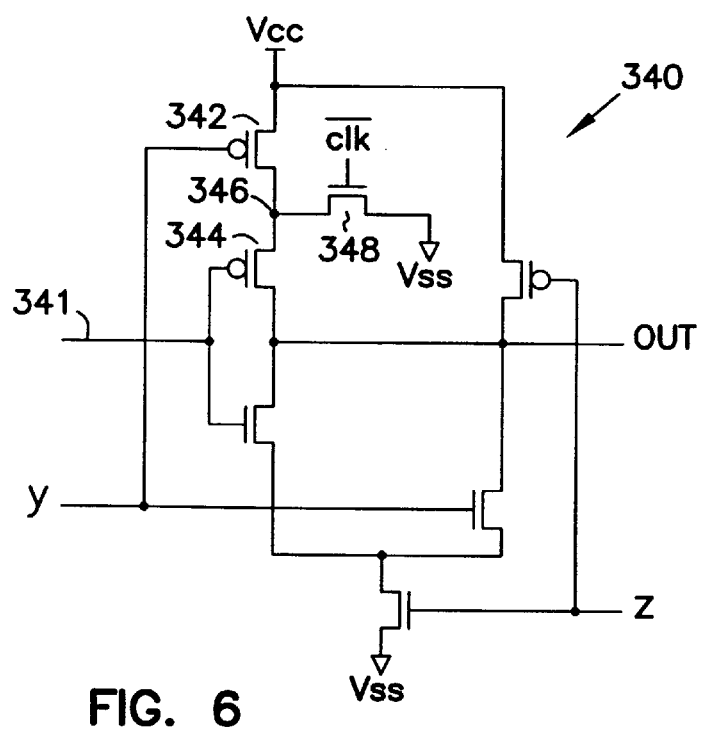
FIG. 6 illustrates a schematic diagram of one embodiment of a static stage circuit of the present invention.

FIG. 6 illustrates a schematic diagram of one embodiment of a static stage 340 of a domino circuit of the present invention. The static stage includes multiple pull up transistors 342 and 344, coupled in series, and a pre-discharge circuit 348. As explained in detail below, the pre-discharge circuit provides a low voltage on the intermediate node 346 while the clock signal is in a low logic state. The static stage of FIG. 6 can be coupled to receive an output signal from the dynamic stage illustrated in FIG. 4, or other embodiments of the domino circuit dynamic stage.

For illustrative purposes, the circuit of FIG. 6 can be coupled to the output node of the circuit of FIG. 4. In operation, transistor 310 is turned on when the clock signal (CLK) is in a low state. As such, the output 312 of the dynamic stage is pulled high. This output voltage is maintained high through inverter 314 and pull up transistor 316. The P-channel pre-charge transistors 308 and 310 are also activated when the clock signal is low. These transistors pull the intermediate nodes 307 and 309 of the pull down transistors to a high voltage level (VCC). When the clock signal transitions to a high state, both the pull up transistor 310 in the pre-charge transistors 308 and 310 are deactivated. The output from the dynamic stage will remain high unless the voltage signals provided on the gates of the pull down transistors are all high. That is, if the series coupled pull down transistors are activated, the output node will be pulled low. The pre-charge transistors are provided to increase the noise margin of the pull down transistors.

Output node 312 of the dynamic stage is coupled to an input node 341 of the static stage 340 (FIG. 6). When the clock signal is in a low state, the pre-discharge transistor 348 is activated. This transistor eliminates any charge which may be present on the intermediate node(s) 346 of the series coupled pull up transistors 342 and 344. When the clock signal transitions to a high state, the discharge transistor 348 is turned off and the static stage circuit can respond to an output voltage provided by the dynamic stage. By providing a pre-discharge transistor in the static stage of the domino circuit, the noise immunity of the static stage has been improved.

Figure 7:
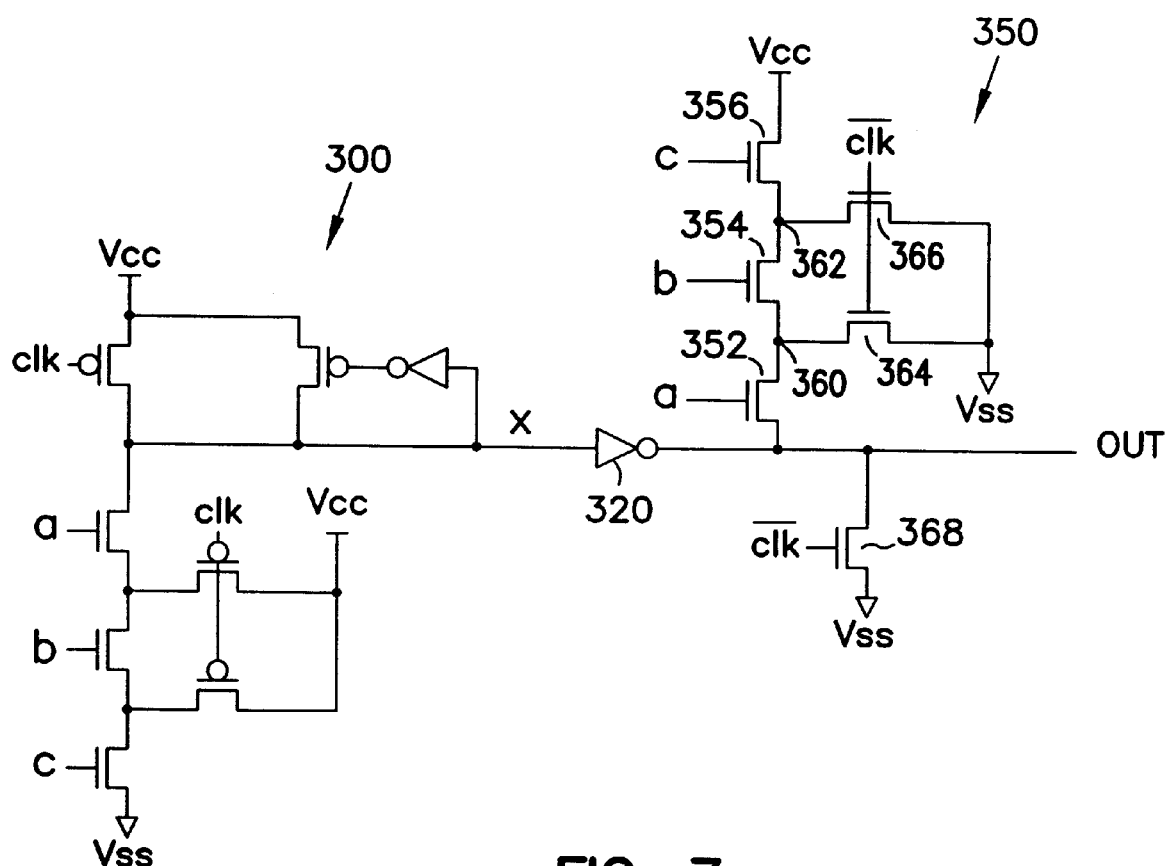
FIG. 7 illustrates another embodiment of the present invention.

FIG. 7 illustrates another embodiment of the present invention having a static circuit 350 with a plurality of series coupled n-channel transistors 352, 354 and 356. These transistors are stacked to operate as a source follower circuit, and have intermediate nodes 360 and 362 between each of the series coupled transistors.

Discharge transistors 364 and 366 are coupled to these intermediate nodes and coupled to receive an inverse clock signal (/clk). Likewise, a pull down transistor 368 is coupled to the output of inverter circuit 370. FIG. 7 illustrates one example dynamic stage 300 (FIG. 4) of the domino circuit that can be used with the present invention. This dynamic circuit can be coupled to an input node of the inverter circuit 370, or other static circuit.

In operation, the intermediate nodes 360 and 362 of the source follower circuit are coupled to ground when the clock signal is low. Further, the input of the inverter circuit is coupled high through P-channel transistor 310 and the output of inverter is further pulled low by the pull down transistor 366. The embodiment of FIG. 7, therefore, uses p-channel pre-charge transistors for the dynamic stage and n-channel transistors to discharge nodes in the static stage. This provides better noise immunity.

Figure 8:
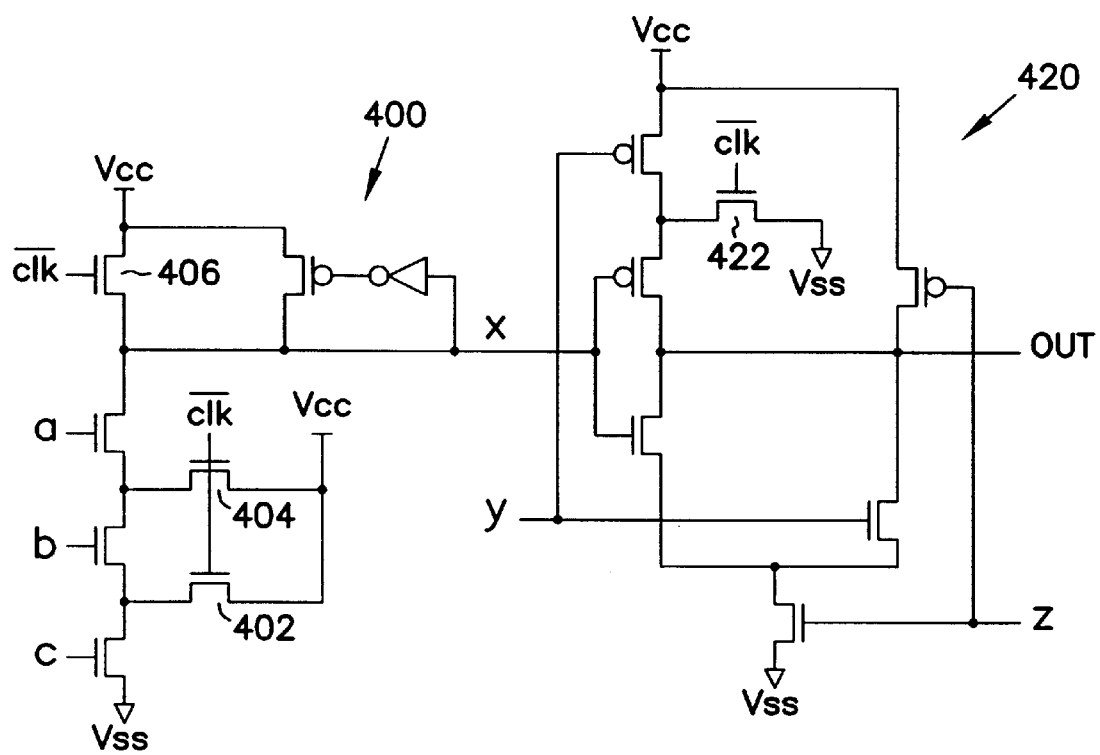
FIG. 8 illustrates another embodiment of the present invention.

FIG. 8 illustrates another embodiment of the present invention which has a dynamic stage 400 with n-channel pre-charge transistors 402 and 404, and an n-channel pull up transistor 406. Further, static stage 420 includes an n-channel discharge transistor 422. All of these n-channel transistors are coupled to receive an inverse clock signal on their gate connection. As such, only one clock signal is required to precondition both the static circuit in the dynamic circuit.

Figure 9:
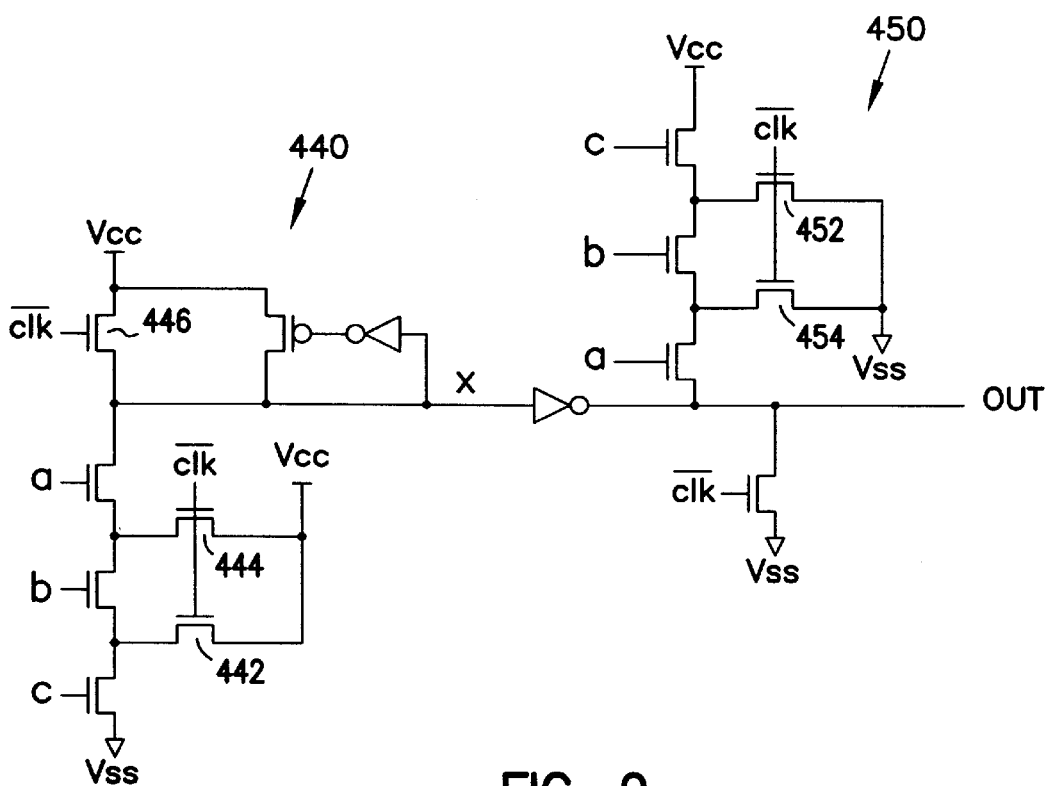
FIGS. 9–11 illustrate schematic diagrams of other embodiments of the present invention.

FIG. 9 illustrates a schematic diagram of another embodiment of the present invention similar to that illustrated in FIG. 7. In this embodiment, however, dynamic stage 440 includes n-channel pre-charge transistors 442 and 444 and an n-channel pull up transistor 446. Static circuit 450 also includes n-channel discharge transistors 452 and 454. Again, all of these n-channel transistors are coupled to receive an inverse clock signal on their gate connection. Thus, this embodiment requires only one clock signal to precondition both the static in dynamic circuits.

Thus, the above circuits require more time to turn on and pull an output connection of the dynamic stage to ground. As such, noise provided on the gate connections is less likely to change the output of the dynamic circuit. In the similar manner, pull-up transistors of the static stage circuit are less likely to change an output voltage of the static circuit in response to noise. It is noted, however, that the response time of the circuit of FIGS. 7–9 has been increased at the expense of providing noise immunity.

Figure 10:
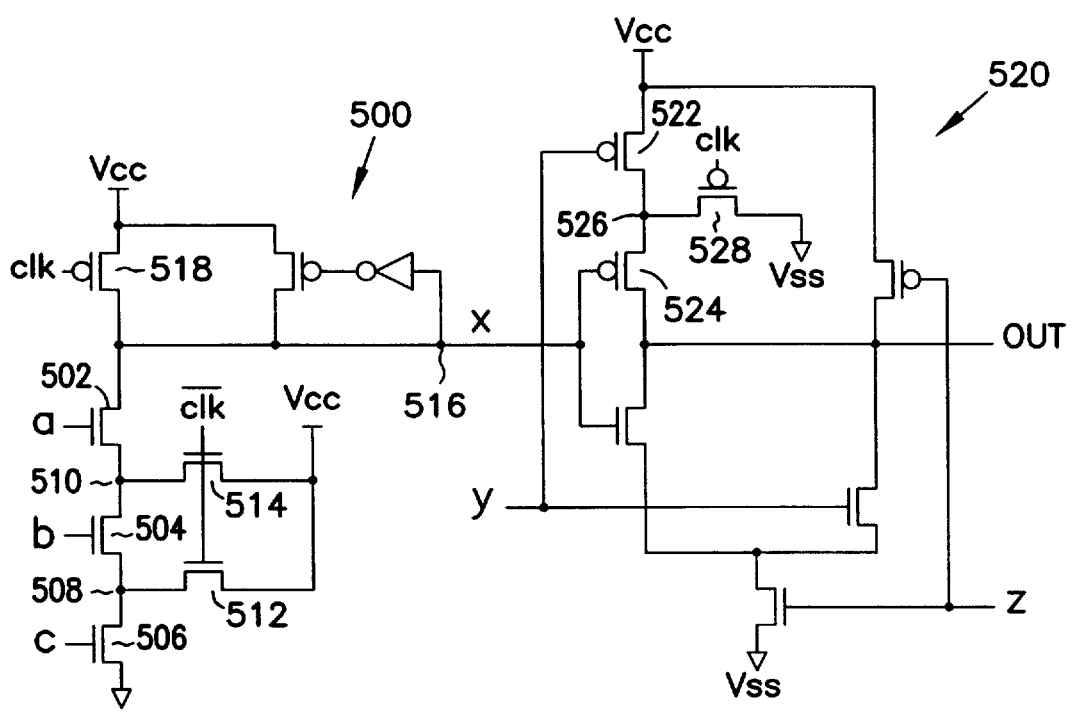
Figure 11:
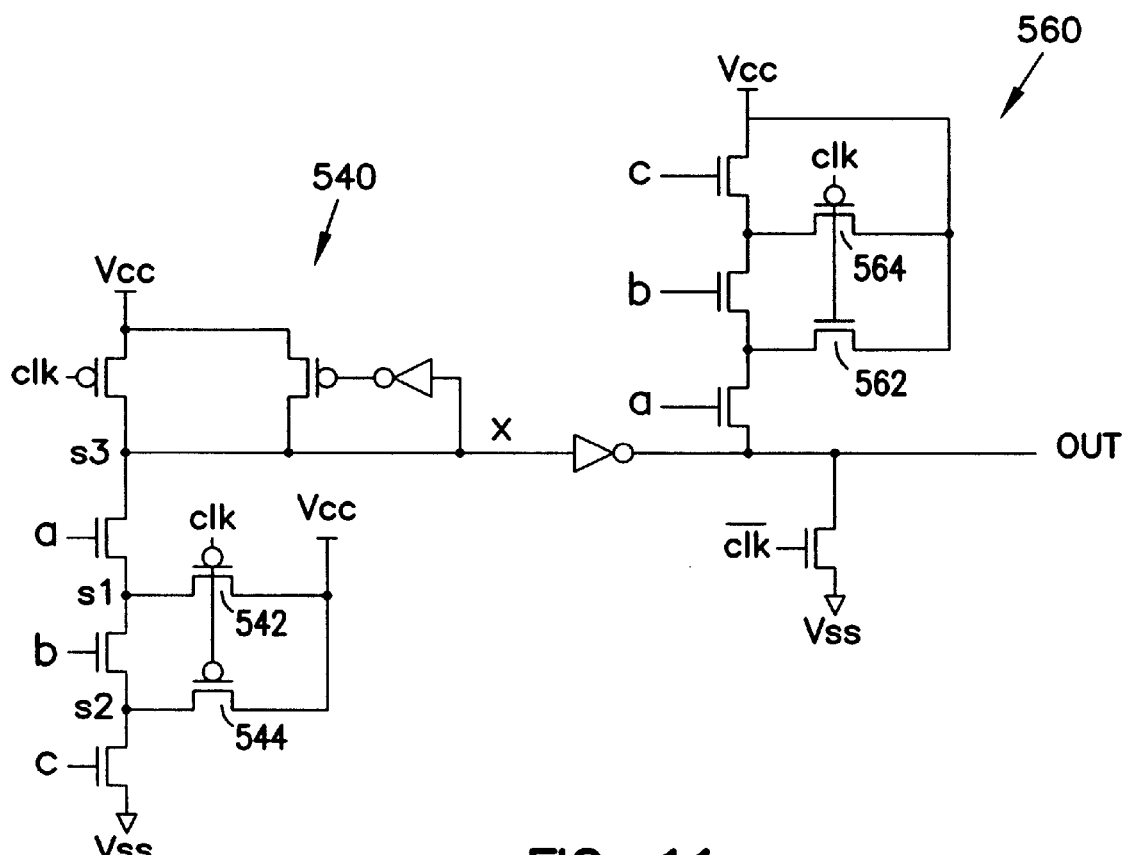

The above described circuits precondition the dynamic and static stages by either discharging or pre-charging the intermediate nodes of pull-down or pull-up series coupled transistor trees. By preconditioning these intermediate nodes in the manner described, the noise immunity of the domino circuit can be increased. Two additional embodiments of the present invention are illustrated in FIGS. 10 and 11 which speed a response time by preconditioning the intermediate nodes of series coupled transistors and a different manner. That is, a response time of the series coupled transistors is reduced, but noise immunity is reduced. Referring to FIG. 10, dynamic stage circuit 500 has a plurality of n-channel pull-down series coupled transistors 502, 504 and 506. Intermediate nodes 508 and 510 of these transistors are coupled to discharge transistors 512 and 514. These discharge transistors are n-channel transistors coupled to receive an inverse clock signal on their gate connection. Static stage 520 illustrated in FIG. 10 has series coupled pull-up transistors 522 and 524 with an intermediate node 526 that is connected to a pre-charge transistor 528. This pre-charge transistor is a P-channel transistor coupled to receive the clock signal on its gate connection. In operation, when the clock signal is low, P-channel pull up transistor 518 is activated to pull the dynamic stage output 516 high. At the same time discharge transistors 514 and 516 are activated to pull the intermediate nodes 508 and 510 of the pull-down transistors low. Also, the P-channel pull up transistor 528 is activated to pre-charge the intermediate node 526 of the static stage circuit.

Referring to FIG. 11, another embodiment is illustrated similar to that of FIG. 10. Again, dynamic stage 540 includes discharge transistors 542 and 544. Likewise the second static circuit 560 includes pre-charge transistors 562 and 564 coupled to intermediate nodes of the source follower transistors. It will be appreciated by those skilled in the art with the benefit of the present disclosure that either n-channel transistors and P-channel transistors can be used for either the pre-charge or discharge transistors of FIGS. 10 and 11. The type of transistor is primarily dependent on which clock signal is selected as a control signal for these transistors.

Figure 12:
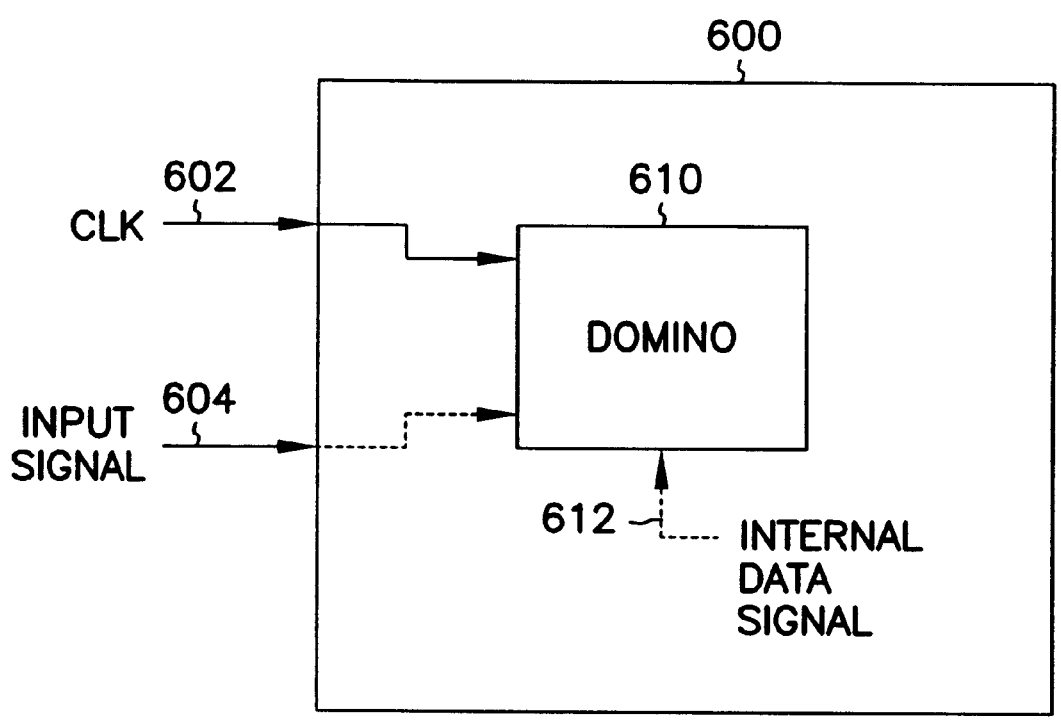
FIG. 12 illustrates a block diagram of an integrated circuit of the present invention.

FIG. 12 illustrates a block diagram of an integrated circuit 600 of the present invention. The integrated circuit receives a clock signal 602, and at least one input data signal 604. The input data signal can be coupled to an internal domino circuit 610 for processing by internal circuitry. Again, the domino circuit can alternately process an internal data signal 612. The domino circuit can be arranged as described above with reference to FIGS. 6 through 11. The integrated circuit can be any type of integrated circuit, including but not limited to a processor, memory, memory controller or application-specific integrated circuit (ASIC). While the present invention is illustrated as receiving an inverse clock signal for operating the pull-down circuitry, it will be appreciated that the terms clock signal and inverse clock signal merely refer to relative logic states, and can be used interchangeably.

Conclusion

A domino logic circuit has been described that includes input connections to receive a clock signal and at least one input data signal. In one embodiment, the domino logic circuit includes a dynamic stage comprising precharge circuitry, and a static stage that comprises discharge circuitry. In another embodiment, the domino logic circuit includes a dynamic stage comprising discharge circuitry, and a static stage that comprises precharge circuitry. Different configurations and transistor types have also been described. The circuitry can provide improved speed performance, or increase noise immunity.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A domino circuit comprising:
   a dynamic circuit stage having at least one data input node to receive at least one input data signal, a clock input node to receive a clock signal and an output data node to provide an output data signal on when the clock signal is a first state; and
   a static circuit stage having an input node coupled to receive the output data signal from the dynamic circuit stage, the static circuit stage comprising a plurality of series coupled pull-up transistors coupled to the at least one data input signal, and a precondition circuit coupled to a first intermediate node located between the plurality of pull-up transistors, the precondition circuit provides either a pre-charge or discharge voltage to the first intermediate node when the clock signal is in a second state.

2. The domino circuit of claim 1 wherein the precondition circuit is a transistor coupled between the intermediate node and a ground connection, a gate connection of the transistor is coupled to receive the clock signal.

3. The domino circuit of claim 1 further comprising an inverter circuit coupled between the dynamic circuit stage and the static circuit stage.

4. The domino circuit of claim 1 wherein the first state of the clock signal is a high logic signal, and the second state of the clock signal is a low logic signal.

5. The domino circuit of claim 1 wherein the dynamic circuit stage comprises:
   a plurality of pull-down transistors coupled in series between the output data node and a ground connection, a second intermediate node located between the plurality of pull-down transistors; and
   a second precondition circuit coupled to the second intermediate node to provide either a pre-charge or discharge voltage to the second intermediate node when the clock signal is in the second state.

6. The domino circuit of claim 5 wherein the second precondition circuit is a transistor coupled between the second intermediate node and a voltage supply connection, a gate connection of the transistor is coupled to receive the clock signal.

7. The domino circuit of claim 5 wherein the first precondition circuit couples the first intermediate node to the ground connection to discharge the first intermediate node, and wherein the second precondition circuit couples the second intermediate node to a voltage supply connection to pre-charge the second intermediate node.

8. The domino circuit of claim 7 wherein the first precondition circuit is an n-channel transistor with a gate connection coupled to receive an inverse clock signal, and a second precondition circuit is a P-channel transistor with a gate connection coupled to receive the clock signal.

9. The domino circuit of claim 5 wherein the first precondition circuit couples the first intermediate node to a voltage supply connection to pre-charge the first intermediate node, and wherein the second precondition circuit couples the second intermediate node to the ground connection to discharge the second intermediate node.

10. The domino circuit of claim 7 wherein the first precondition circuit is a p-channel transistor with a gate connection coupled to receive a clock signal, and a second precondition circuit is an n-channel transistor with a gate connection coupled to receive an inverse clock signal.

11. A domino circuit comprising:
    a dynamic stage circuit having an output connection, the dynamic stage circuit comprising a first pull-up transistor coupled to the output connection, a latch circuit coupled to the output connection, and a plurality of pull-down transistors coupled to the output connection, the dynamic stage circuit further comprising a pre-charge transistor coupled to a first intermediate node of the plurality of pull-down transistors; and
    a static stage circuit having an input node coupled to the output connection of the dynamic stage circuit, the static stage circuit comprising an output node and a plurality of pull-up transistors connected in series between the output node and an upper voltage supply connection, a discharge transistor coupled to a second intermediate node of the plurality of pull-up transistors.

12. The domino circuit of claim 11 wherein the first pull-up transistor is a P-channel transistor having a gate connection coupled to a clock signal, the pre-charge transistor is a P-channel transistor having a gate connection coupled to the clock signal, and the discharge transistor is an n-channel transistor having a gate connection coupled to an inverse of the clock signal.

13. The domino circuit of claim 11 further comprising an inverter circuit coupled between the output connection of the dynamic stage circuit and the input node of the static stage circuit.

14. The domino circuit of claim 11 wherein the first pull up transistor, the pre-charge transistor, and the discharge transistor are all n-channel transistors having gate connections coupled to a clock signal.

15. The domino circuit of claim 14 further comprising an inverter circuit coupled between the output connection of the dynamic stage circuit and the input node of the static stage circuit.

16. A domino circuit comprising:
    a dynamic stage circuit having an output connection, the dynamic stage circuit comprising a first pull-up transistor coupled to the output connection, a latch circuit coupled to the output connection, and a plurality of pull-down transistors coupled to the output connection, the dynamic stage circuit further comprising a discharge transistor coupled to a first intermediate node of the plurality of pull-down transistors; and
    a static stage circuit having an input node coupled to the output connection of the dynamic stage circuit, the static stage circuit comprising an output node and a plurality of pull-up transistors connected in series between the output node and an upper voltage supply connection, a pre-charge transistor coupled to a second intermediate node of the plurality of pull-up transistors.

17. The domino circuit of claim 16 wherein the first pull-up transistor is a P-channel transistor having a gate connection coupled to a clock signal, the pre-charge transistor is a P-channel transistor having a gate connection coupled to the clock signal, and the discharge transistor is an n-channel transistor having a gate connection coupled to an inverse of the clock signal.

18. The domino circuit of claim 16 further comprising an inverter circuit coupled between the output connection of the dynamic stage circuit and the input node of the static stage circuit.

19. A method of increasing response time of a domino circuit comprising:
   pre-charging intermediate nodes of series coupled pull-down transistors of a dynamic stage circuit during a pre-charge phase; and
   discharging intermediate nodes of series coupled pull-up transistors of a static stage circuit coupled to the dynamic stage circuit, where discharging the intermediate nodes is performed during the pre-charge phase.

20. The method of claim 19 wherein an output connection of the dynamic stage circuit is pre-charged during the pre-charge phase.

21. The method of claim 19 wherein the pre-charge phase is performed when an active high clock signal is coupled to the dynamic stage circuit is in an active state.

22. A method of increasing noise immunity of a domino circuit comprising:
   pre-discharging intermediate nodes of series coupled pull-down transistors of a dynamic stage circuit during a pre-charge phase; and
   pre-charging intermediate nodes of series coupled pull-up transistors of a static stage circuit coupled to the dynamic stage circuit, where pre-charging the intermediate nodes is performed during the pre-charge phase.

23. The method of claim 22 wherein an output connection of the dynamic stage circuit is pre-charged during the pre-charge phase.

24. The method of claim 22 wherein the pre-charge phase is performed when an active high clock signal is coupled to the dynamic stage circuit is in an active state.

* * * * *

UNITED STATES PATENT AND TRADEMARK OFFICE
CERTIFICATE OF CORRECTION

PATENT NO. : 6,275,071 B1
DATED : August 14, 2001
INVENTOR(S) : Yibin Ye, Siva G. Narendra and Vivek K. De Page 1 of 1

It is certified that error appears in the above-identified patent and that said Letters Patent is hereby corrected as shown below:

Column 3,
Line 34, insert new ¶ between "phase." and "Fig. 2A".

Column 5,
Lines 36-37, ¶ beginning with "Discharge transistors 364..." should be part of the previous ¶ beginning with "FIG. 7 illustrates another embodiment...".

Signed and Sealed this

Fourteenth Day of May, 2002

Attest:

Attesting Officer

JAMES E. ROGAN
Director of the United States Patent and Trademark Office